United States Patent [19]

Goldschmied et al.

[11] Patent Number: 5,616,362
[45] Date of Patent: Apr. 1, 1997

[54] PROCESS AND APPARATUS FOR THE COATING OF METAL

[75] Inventors: Gerhard Goldschmied; Gerhard Priesch, both of Vienna, Austria

[73] Assignee: Andritz-Patentverwaltungs-Gesellschaft m.b.H., Graz, Austria

[21] Appl. No.: 505,481

[22] Filed: Jul. 21, 1995

Related U.S. Application Data

[62] Division of Ser. No. 250,367, May 27, 1994, abandoned.

[30] Foreign Application Priority Data

Jun. 2, 1993 [AT] Austria ................................ 1070/93

[51] Int. Cl.⁶ ............................................. B05D 3/02
[52] U.S. Cl. ................... 427/328; 427/250; 427/295; 427/307; 427/320; 427/321; 427/405; 427/406; 427/534; 204/192.1; 204/192.15
[58] Field of Search ........................ 427/250, 255.7, 427/295, 307, 320, 321, 328, 405, 534, 406; 204/192.1, 192.15

[56] References Cited

U.S. PATENT DOCUMENTS

| | | | |
|---|---|---|---|
| 3,278,331 | 10/1966 | Taylor et al. | 118/718 |
| 3,326,177 | 6/1967 | Taylor | 118/718 |
| 3,693,582 | 9/1972 | Delcour et al. | 118/718 |
| 3,777,704 | 12/1973 | Van Poucke | 118/718 |
| 4,514,437 | 4/1985 | Nath | 118/718 |
| 4,820,392 | 4/1989 | Moskowitz et al. | 204/192.11 |
| 4,832,809 | 5/1989 | Hodes et al. | 204/192.15 |
| 5,164,230 | 11/1992 | Verspui et al. | 427/250 |
| 5,429,843 | 7/1995 | Masaki et al. | 427/534 |

FOREIGN PATENT DOCUMENTS

| | | | |
|---|---|---|---|
| 0264455A1 | 4/1988 | European Pat. Off. | |
| 0481346A1 | 4/1992 | European Pat. Off. | |
| 3742317A1 | 6/1989 | Germany. | |
| 0349925A1 | 1/1990 | Germany. | |
| 59-153880 | 9/1984 | Japan | 118/718 |
| 62-40373 | 2/1987 | Japan | 118/718 |
| 62-224667 | 10/1987 | Japan | 118/718 |
| 63-20447 | 1/1988 | Japan | 118/718 |
| 63-79966 | 4/1988 | Japan | 118/718 |
| 2-11767 | 1/1990 | Japan | 118/718 |
| 2218111 | 11/1989 | United Kingdom. | |
| 2227252 | 7/1990 | United Kingdom. | |

OTHER PUBLICATIONS

1994 Derwent Info Ltd. Dialog, JP 3207885 (Sep. 11, 1991) Abstract.
1994 Derwent Info Ltd. Dialog, JP 3146688 (Jun. 21, 1991) Abstract.
1994 Derwent Info Ltd. Dialog, JP 1047895 (Feb. 22, 1989) Abstract.
Derwent abstract JP 61–030673 (Jun. 11, 1990).

*Primary Examiner*—Shrive Beck
*Assistant Examiner*—Timothy H. Meeks
*Attorney, Agent, or Firm*—Chilton, Alix & Van Kirk

[57] ABSTRACT

A process for coating metal substrates including cleaning, degreasing and activating the substrate wherein a strongly adhering bonding agent layer is deposited on the substrate. The bonding agent layer comprises a thickness of aluminum. The bonding agent layer is deposited at a temperature not exceeding 300° C.

16 Claims, 1 Drawing Sheet

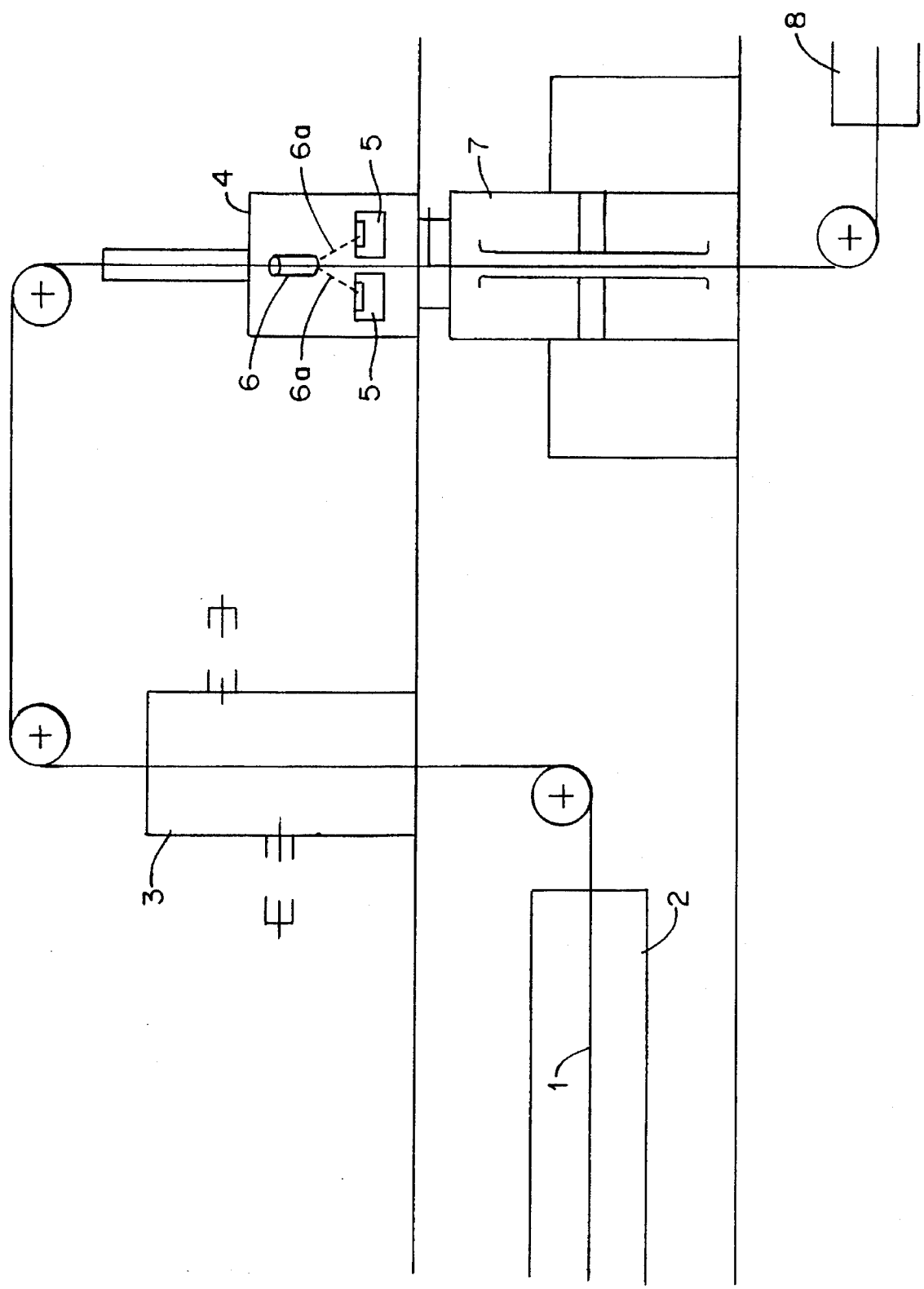

PROCESS AND APPARATUS FOR THE COATING OF METAL

This is a divisional of application Ser. No. 08/250,367 filed on May 27, 1994, now abandoned.

BACKGROUND OF THE INVENTION AND PRIOR ART

The invention relates to a process for coating metal substrates, in particular steel or aluminum sheet in strip form with a coating of metal or metal alloy, including cleaning, degreasing and activating the substrate as well as an apparatus for carrying out the process, comprising a material inlet lock section, a vacuum section including an activating section and a coating section for the application of the coating as well as a material exit lock section.

The coating of metals with other metals or metal alloys is a widely used method in order to render base metals better suitable for various purposes. Thus, for example, increased attempts have been made lately to employ aluminum alloys as materials for vehicle bodies of motor vehicles in order to save weight. Essentially for that purpose a self-hardening aluminum alloy composed of 95.2% Al, 4.5% Mg and 0.3% Mn can be used for the interior components and a secondarily hardenable and flow line free aluminum alloy composed of 98.4% Al, 0.4% Mg and 1.2% Si for body shell components. Even though Al-sheet metal of the secondarily hardenable alloy offers strength characteristics which are comparable to steel sheet, such sheet metal is nevertheless employed nowadays only rarely for motorcar construction inspite of a 45% weight saving. The reasons, therefore, are the poor phosphatising properties and poor enamelling properties as compared with steel and the poor spot-welding properties, due to the high electrical resistance resulting from the oxide layer, for which reason the aforesaid aluminum sheets cannot be processed in existing production lines.

Accordingly, attempts are being made increasingly to avoid these drawbacks by the application of a zinc coating. Initially this was attempted electrolytically. In order to attain a strongly adhering coating, it is then necessary to remove the highly reactive oxide layer prior to coating. In JP-B-90050989 and in JP-1047895 processes that purpose are described in which, by means of a dipping treatment, (zincate process) the oxide layer is removed and simultaneously a thin (0,5 μm) zinc layer is applied. The zinc coating proper takes place subsequently electrolytically. JP-A-03207885 and JP-A-314668 disclose the electrolytic application of a zinc coating in baths containing fluoride or chloride. However, those processes suffer from the disadvantage that they involve high energy expenditure, cause effluent problems, that zinc sludge is produced which must be disposed of and that they can, in may cases, be carried out only as a multiple-stage process.

More recently, coating by means of vacuum vapor coating has been gaining increasing importance for being an environmentally friendly process. The aforesaid disadvantages can be avoided by vapor deposition in a vacuum. In order to attain strongly adhering coatings in such processes, the metals substrate is preferably subjected to a pre-treatment in a vacuum comprising generally a pre-treatment of the strip to temperatures of 200° to 300° C. Where aluminum is the substrate material, higher pre-heating temperatures of about 300° to 400° C. are necessary because of the oxide layer. With steel, specifically when applying zinc coating, even higher temperatures of about 400° to 500° C. are necessary. In order to avoid re-evaporation, the substrate must then be cooled prior to coating, which from a process point of view involves substantial disadvantages. Moreover, in the case of hardenable aluminum materials, a deterioration of the mechanical properties is experienced.

OBJECTS AND GENERAL DESCRIPTION OF THE INVENTION

It is, therefore, an object of the present invention to provide a coating process which avoids the aforesaid disadvantages of conventional processes and which permits the application of strongly adhering coatings on metal substrates without major environmental impact.

A further object resides in an apparatus for carrying out such a process.

In order to attain the objects, the aforedescribed process is characterised by the application of a bonding agent layer after activation. Due to the provision of a bonding agent layer, it is possible to apply onto metal substrates coatings with great bonding strengths by a vacuum process and thereby in an environmentally friendly manner. In this manner it is in particular possible to provide steel or aluminum, the term to include aluminum alloy, with a strongly adhering coating, preferably a zinc coating. The substrate may, in tills context, be provided in the form of individual work pieces or in strip form. Adhesion strength, enamelling and spot-weldability tests carried out on work pieces produced according to the process in accordance with the invention have shown that, for example, in the case of zinc coatings on aluminum substrates similarly good properties can be attained as with steel sheet. Accordingly, when applied to vehicle body parts—composed of steel and coated aluminum sheets—dip phosphatising in a single processing step is possible. Moreover, due to the avoidance of sludges and effluents which need to be disposed of, the application proceeds in a very environmentally friendly manner. The thickness of the coating applied onto the bonding agent layer can vary within very wide limits and may, for example, in the case of zinc, amount to between 0.1 and 20 μm, preferably 2 to 7 μm, and this applies in the case of strip-shaped substrates both to one-sided as well as dual-sided coating.

According to an embodiment of the process according to the invention the activation of the substrate proceeds by pre-heating.

According to a further embodiment the activation of the substrate proceeds by ionic etching, optionally after pre-heating of the substrate.

Advantageously a bonding agent coating of aluminum is applied. In the case of steel substrates, this offers the additional advantage that the corrosion protection thereof is increased because on the one hand the coating layer adheres better, and simultaneously the aluminum layer itself provides corrosion protection.

In order not to change the mechanical properties of the substrate material, in particular in the case of aluminum substrates, a further feature of the invention provides that the application of the bonding agent layer takes place at temperatures not exceeding 300° C., preferably 250° C., in particular being less than 140° C., preferably less than 100° C. and that in the subsequent process steps a temperature of 300° C., preferably 190° C. is not exceeded. Even in the case of aluminum substrates, the temperatures thereof after the application of a zinc coating—depending on the sheet thickness and the coating thickness—amounts to not more than 300° C., more preferably even only between 160° and 190° C., so that the re-evaporation of the applied coating can be avoided.

The bonding agent layer is preferably applied until a thickness of 0.1 to 2 μm, preferably 0.3 m is attained.

According to a further feature of the invention the application of the bonding agent layer is preferably carried out by sputtering.

It stands to reason that the metal substrate can be provided on both sides with the bonding agent layer and the coating layer.

The apparatus for coating of metal substrates in a vacuum is characterised, according to the invention, in that in the vacuum section between the activation section and the coating section for the application of the coating layer an additional coating section for the application of the bonding agent layer is provided. It is possible to design the apparatus for the coating of individual work pieces or even for coating of a substrate in the form of strip.

For the coating of a work piece or strip on both sides, at least two evaporator crucibles, containing the material for the bonding agent layer, are provided, one on each of the opposite sides of the metal substrate.

Preferably, for heating the material in the evaporator crucibles, at least one means for generating an electron beam is provided.

In this context the apparatus construction can be simplified in that means for generating only one electron beam and means for the cyclical or oscillatory deflection of the single electron beam into one evaporator crucible at a time is provided.

It will be readily understood by those skilled in the art that the teachings of the invention can be applied not only to steel and aluminum sheets, but also to other sheet metal, notably non-ferrous heavy metal sheet.

In the following description the invention is to be further explained with reference to the accompanying drawing.

BRIEF DESCRIPTION OF THE DRAWING

The drawing shows a diagrammatic illustration of an apparatus for coating a strip-shaped metal substrate according to the present invention.

DESCRIPTION OF SPECIFIC EMBODIMENTS OF THE INVENTION

Referring now to the drawing, the metal strip 1 is brought into the vacuum region of the installation through the material inlet lock section 2. In the course thereof fine cleaning and/or activation of the strip is carried out in a pressure range of $10^{-1}$ to $10^{-4}$ mbar, preferably $10^{-3}$ mbar. The belt 1 enters into a pre-heating station 3 and thereafter proceeds to a coating section 4 for the application of a bonding agent layer onto the belt 1. The coating section 4 includes one evaporator crucible 5 each containing the metal or metal alloy to be applied onto the belt 1 on each side of the belt 1. The coating section 4 in addition includes means 6 for generating at least one electron beam 6a. Preferably only a single electron beam is generated which is directed alternatingly onto the two evaporator crucibles 5 by further means—not illustrated. It would also be possible to heat the material in the crucible 5 by resistance heating instead of by the electron beam.

Finally, the strip 1 provided with the bonding agent coating enters into the coating section 7 for applying the coating. This section may be designed in the same manner as or differently from the coating section 4. The vacuum in the section 7 and preferably also in the section 4 amounts to $10^{-2}$ to $10^{-4}$ mbar, preferably $10^{-3}$ mbar.

Through the material exit lock section 8 the belt 1, now completely coated with a bonding agent and a coating layer, once again exits from the apparatus according to the invention.

WORKING EXAMPLE 1:

Sheets of aluminum alloy AlMg0.4Si1.2, having a sheet thickness of 1 mm were pre-treated by degreasing in conventional degreasing baths, by pre-heating and activating the surface by means of ionic etching. Thereafter the bonding agent coating, in this case an aluminum coating and subsequently a coating layer of zinc, were applied. For this purpose an electron beam was employed as the evaporator means. The process parameters are apparent from the following table (all of the given temperatures apply at least to the end of the respective process step):

| Process Step | Process Parameters | Result |
| --- | --- | --- |
| Degreasing | 40 g/l NaOH, 20 g/l Na$_3$PO$_4$ + Wetting agent, bath temperature: 90° C. | Grease-free Surface |
| Pre-heating by electronic beam | Beam Output P = 8 kW, Preheating Period: 30s, Substrate Temperature: 90° C. | Releasing the Water Skin |
| Magnetic field-supported ionic etching | Etching Output 2 kW, Etching Period 180s, Substrate Temperature: 140° C. | Activated Surface |
| Al - vaporcoating | Beam Capacity P = 80 kW, Time 30s, Substrate Temperature: approx. 150–160° C. | Bonding Agent Layer 0.3 μm |
| Zn - vaporcoating | Beam Output P = 22 kW, Time 60s, Substrate Temperature: approx. 180° C. | Coating Layer 5 μm |

WORKING EXAMPLE 2:

A steel strip having a thickness of 0.65 mm was subjected to similar treatment steps as the aluminum substrate according to Working Example 1. The process parameters were as follows:

| Process Step | Process Parameters | Result |
| --- | --- | --- |
| Pre-heating by means of electron beams | Beam Output P = 8 kW, Preheating Period 90s, Substrate Temperature: 221° C. | Release of the Water Skin and Activation of the Surface |
| Al-vaporcoating | Beam Output P = 80 kW, Time 30s, Substrate Temperature: 238° C. | Bonding Agent Layer 0.3 μm |
| Zn-vaporcoating | Beam Output P = 22 kW, Time 60s, Substrate Temperature: 242° C. | Coating 5 μm |

The claims which follow are to be considered an integral part of the present disclosure. Reference numbers (directed to the drawings) shown in the claims serve to facilitate the correlation of integers of the claims with illustrated features of the preferred embodiment(s), but are, not intended to restrict in any way the language of the claims to what is shown in the drawings, unless the contrary is clearly apparent from the context.

What we claim is:

1. Process for coating metal substrates with a coating layer, including cleaning and degreasing followed by activation of the substrate in a vacuum and application of the coating layer in a vacuum, wherein the improvement comprises a step that after activation and prior to application of the coating layer selected from the group consisting of zinc and zinc alloy, a bonding agent layer of aluminum is applied under vacuum to the activated substrate, wherein the substrate is Selected from the group consisting of steel sheet, non-ferrous heavy metal sheet and aluminum sheet.

2. Process according to claim 1, wherein the activation of the substrate proceeds by pre-heating.

3. Process according to claim 1, wherein the activation of the substrate takes place by ionic etching.

4. Process according to claim 3, wherein the ionic etching is preceded by pre-heating of the substrate.

5. Process according to claim 1, wherein the application of the bonding agent layer takes place at a temperature not exceeding 300° C., and a temperature of 300° C. is not exceeded during application of the coating layer.

6. Process according to claim 5, wherein the application of the bonding layer takes place at a temperature not exceeding 250° C.

7. Process according to claim 5, wherein the application of the bonding layer takes place at a temperature of less than 140° C.

8. Process according to claim 5, wherein the application of the bonding layer takes place at a temperature of less than 100° C.

9. Process according to claim 5, wherein a temperature of 190° C. is not exceeded during application of the coating layer.

10. Process according to claim 1, wherein the bonding agent layer is applied until a thickness of the bonding agent layer of 0.1 to 2 μm has been attained.

11. Process according to claim 10 wherein the bonding agent layer is applied until a thickness of the bonding agent layer of about 0.3 μm has been attained.

12. Process according to claim 1, wherein the bonding agent layer is applied by sputtering.

13. Process according to claim 1, wherein the metal substrate is coated on both sides with said bonding agent layer and the coating layer.

14. Process according to claim 1, wherein both sides of the metal substrate are simultaneously coated with the bonding agent layer.

15. Process according to claim 14, wherein both sides of the metal substrate are simultaneously coated with the coating layer.

16. Process for coating metal substrates with a coating layer, including cleaning and degreasing followed by activation of the substrate in a vacuum and application of the coating layer in a vacuum, wherein the improvement comprises a step that after activation and prior to application of the coating layer selected from the group consisting of zinc and zinc alloy, a bonding agent layer of aluminum is applied under vacuum to the activated substrate at a temperature not exceeding 300° C.

* * * * *